(12) United States Patent
Livni et al.

(10) Patent No.: US 6,467,157 B1
(45) Date of Patent: Oct. 22, 2002

(54) APPARATUS FOR CONSTRUCTION OF ANNULAR SEGMENTED PERMANENT MAGNET

(75) Inventors: Avinoam Livni, Haifa; Yoav Katz, Benyamina, both of (IL)

(73) Assignee: Odin Technologies, Ltd., Yokneam Flit (IL)

( * ) Notice: Subject to any disclaimer, the term of this patent is extended or adjusted under 35 U.S.C. 154(b) by 0 days.

(21) Appl. No.: 09/492,050

(22) Filed: Jan. 26, 2000

(51) Int. Cl.⁷ .......................... B23P 19/00; H01M 19/00
(52) U.S. Cl. .................. 29/737; 29/607; 29/744; 29/762; 29/419.2; 29/602.1; 29/719; 29/759; 29/760; 29/DIG. 95; 29/DIG. 105; 269/13; 269/14
(58) Field of Search .................. 29/607, 737, 744, 29/762, 419.2, 602.1, 719, 759, 760, DIG. 95, DIG. 105; 269/13, 14

(56) References Cited

U.S. PATENT DOCUMENTS

| | | | | |
|---|---|---|---|---|
| 3,749,993 A | * | 7/1973 | Laman | 318/563 |
| 4,173,817 A | * | 11/1979 | Voglrieder et al. | 29/596 |
| 4,614,929 A | * | 9/1986 | Tsukuda et al. | 335/284 |
| 4,728,987 A | * | 3/1988 | Diola et al. | 355/3 |
| 4,737,753 A | * | 4/1988 | Oudet | 335/284 |
| 4,924,186 A | * | 5/1990 | Kawamoto et al. | 324/320 |
| 5,025,240 A | * | 6/1991 | La Croix | 335/284 |
| 5,148,138 A | * | 9/1992 | Miyata | 335/302 |
| 5,250,255 A | | 10/1993 | Sagawa et al. | 419/39 |
| 5,304,933 A | | 4/1994 | Vavrek et al. | 324/318 |
| 5,382,904 A | * | 1/1995 | Pissanetzky | 324/319 |
| 5,428,292 A | * | 6/1995 | Dorri et al. | 324/319 |
| 5,604,815 A | * | 2/1997 | Paddock | 381/192 |
| 5,659,250 A | * | 8/1997 | Domigan et al. | 324/320 |
| 5,720,922 A | * | 2/1998 | Ghaed et al. | 422/52 |
| 5,774,976 A | * | 7/1998 | Stark | 29/732 |
| 6,157,281 A | * | 12/2000 | Katznelson et al. | 335/306 |
| 6,163,240 A | * | 12/2000 | Zuk et al. | 335/299 |

* cited by examiner

*Primary Examiner*—Peter Vo
*Assistant Examiner*—Paul D Kim
(74) *Attorney, Agent, or Firm*—Pennie & Edmonds LLP

(57) ABSTRACT

An apparatus is provided for constructing a segmented annular permanent magnet from a predetermined number of previously magnetized segments of predetermined shape and size comprising a rotateable carrousel, at least two of a plurality of removable ferromagnetic segments, an introducing means and a removing means.

29 Claims, 2 Drawing Sheets

APPARATUS FOR CONSTRUCTION OF ANNULAR SEGMENTED PERMANENT MAGNET

FIELD OF THE INVENTION

The present invention relates to magnet construction. More particularly it relates to a method for the construction of annular permanent magnets, especially but not solely for use in MRI systems, and an apparatus for constructing such magnets.

BACKGROUND OF THE INVENTION

Magnetic resonance imaging systems are known in the art. The remarkable soft tissue contrast resolution associated with these techniques is invaluable and renders these techniques high appreciation among the medical community.

Basically MRI techniques exploit nuclear magnetism induced on the patient's tissues, eliciting Radio-Frequency induced signal response which is picked up, analyzed and processed to obtain an image of the imaged region of the patient's tissue (a very clear explanation of the MRI principles is provided by Joseph P Homak, of the Rochester Institute of Technology, on the World Wide Web, http://www.cis.rit.edu/htbooks/mri/mri-main.htm, and see also U.S. Pat. No. 5,304,933 (Vavrek et al.), titled SURGICAL LOCAL GRADIENT COIL).

The first stage of MRI involves the aligning of the patient's tissue nucleons magnetic spins. This is achieved by placing the patient (or the patient's organ to be imaged) in a strong magnetic field generated by a strong permanent magnet or a super-conductive magnet. It is imperative that the magnetic field in the field of view of the system be homogeneous, as distorted field may result in the distortion of the image and the appearance of artifacts in the image.

Super-conductive magnets can produce extremely strong and substantially homogeneous magnetic fields (typical magnet strength in known MRI systems may be as high as 2 Tesla). See for example U.S. Pat. No. 4,924,186 (Matsutani) titled MAGNET APPARATUS FOR USE IN MAGNETIC RESONANCE IMAGING SYSTEM. These are large superconductor magnets, which take up a large space (sometimes as large as a room), are expensive and require high operating and maintenance costs. The large size of these magnets prevents any access to the patient.

However, recently it was realized that whole body imaging is not necessary for the performance of an interventional medical procedure on a patient in an MRI system. It has been realized that, in fact, a machine with a restricted field of view performs satisfactorily in such a setting and can be built in a more efficient and economical fashion than one built for accommodating a whole body. Furthermore, in order to leave an open access to reach conveniently the part of the body on which the intervention is performed, compact magnet assemblies were introduced.

Israel Pat. Appl. No. 119558 (Katznelson et al.) filed Nov. 4, 1996, discloses a compact, mobile, intra-operative MRI System, which includes a host computer coupled to a central electronics system which may be coupled to different MRI probes.

In U.S. Pat. No. 5,428,292 (Dorri et al.), filed Apr. 29, 1994, A pancake-like MRI magnet was disclosed, presenting a relatively narrow lateral cross-section.

Usually permanent magnet assemblies for MRI systems incorporate ferromagnetic structures for the creation of return paths of the magnetic flux. Attaching ferromagnetic (usually iron) annular plates on the surface of the magnet facing the patient act as magnetic field uniformity enhancement.

U.S. Pat. No. 5,900,793 (Katznelson et al.), filed Jul. 23, 1997, titled PERMANENT MAGNET ASSEMBLIES FOR USE IN MEDICAL APPLICATIONS, described, inter alia, compact permanent magnet assemblies for use in medical applications, including MRI and/or MRT (Magnetic Resonance Therapy). It consists of a plurality of annular concentric magnets, spaced apart along their axis of symmetry. The magnet assemblies disclosed in that patent are not provided with a ferromagnetic structure.

Permanent magnets are made of non-rare or rare earth magnetic materials. Non-rare earth magnets include Alnico (Aluminum-Nickel-Cobalt) magnets and Ceramic (Strontium and Barium Ferrite) magnets. Rare earth magnets include Sm—Co (Samarium-Cobalt) magnets and Nd—Fe—B (Neodymium-Iron-Boron) magnets.

The conventional manufacturing method of a permanent magnet involves compressing the magnet material, which is available in the form of powder, shaping it into a predetermined shape, and then magnetizing it by placing it in an extremely strong electromagnetic field (in the order of 3 Tesla). This powerful electromagnetic field, which permanently aligns the magnetic dipoles of the matter is generated by passing powerful electric current produced by discharging a large number of capacitors in a predetermined switching sequence through a copper or super-conductive coil within which the item to be magnetized is placed. See, for example, U.S. Pat. No. 5,250,255 (Segawa et al.), titled METHOD FOR PRODUCING PERMANENT MAGNET AND SINTERED COMPACT AND PRODUCTION APPARATUS FOR MAKING GREEN COMPACTS.

MRI magnets may be cylindrical in their shape, suitable for reception of a patient within the internal space of the cylinder. as illustrated in U.S. Pat. No. 5,659,250 (Domigan et al.). In interventional MRI systems, which require that the patient be accessible to the medical staff, when positioned within the magnetic field, the magnetic field is usually produced by two magnet assemblies that are positioned opposite each other, allowing reception of the patient in between. MRI systems can also utilize a single magnet to produce an image.

Permanent magnets used in MRI systems that require accessibility of the patient are usually annular in their shape. In order to prevent substantial eddy currents induced by the strong magnetic field, MRI magnets are usually segmented, formed from magnetic segments, and glued to each other using a non-conductive adhesive. Thus the generation of eddy currents over the whole magnet is prevented, limiting possible eddy current induction to the segments.

The size of magnets produced in this manner is limited by the size of the coil used for magnetization, which itself is limited by the minimal electromagnetic filed strength required for effective magnetization. It is noted that in order to effectively magnetize the magnet material it has to be subjected to a strong magnetic field that generates magnetic flux within the material exceeding the saturation flux (the flux at which al the magnetic dipoles within the material align). For Nd—Fe—B the saturation magnetic flux is about 1.35 Tesla, and for practical reasons it is customary to subject the magnetic material to magnetic fields of twice or more the stated flux.

In view of the above mentioned considerations it is therefore why small magnetic rings are produced in the following manner first, the magnet segments are shaped roughly to form sectors of the ring. Then their sides, designated to be glued to other segments, are ground and the segments are bonded together (using an insulating adhesive) to form the ring. Then the ring undergoes further mechanical processing to bring it to its final shape and dimensions, and finally the whole construction is magnetized.

The manufacturing procedure described above is followed sequentially in the provided order, for if the segments were to be magnetized prior to their joining together, it would be very difficult to adhere the magnetized segments together. As the magnetized segments are drawn closer strong magnetic repulsion forces act on the magnetized segments attempting to flip the segments over, so as to bring opposite polarities to face each other. Therefore enormous forces are required to position the segments adjacent each other and hold them firmly while the adhesive hardens.

The problem with the method discussed above is that it is impossible to control or predict the level of homogeneity of the magnetic field of the constructed magnet that would be attained in this process. In MRI applications it is imperative that the produced magnet possessed a substantially homogeneous magnetic field. However irregularities in the magnetic material, as well as flaws in the magnetization process could render the manufactured magnet non-homogeneous and therefore useless. The larger the magnetized object is the greater the risk of obtaining irregularities in its induced magnetic field.

Due to the limitations imposed on the size of objects that can be magnetized by coils, it is evident that constructing larger annular magnets can only be achieved by joining together previously magnetized segments. Furthermore, it was found that from magnetic field considerations (the major consideration in the construction of MRI magnets) it is far better to select a number of segments from a group of magnetized segments possessing same magnetic strength, than to magnetize a whole annular magnet, and be faced with the possibility of substantial irregularities in the magnetic field.

It is therefore the purpose of the present invention to provide a novel method and apparatus for the manufacture of annular permanent magnets, suitable for MRI applications involving the construction of magnets from previously magnetized segments. Thus greater magnetic field homogeneity is achieved and the risk of manufacturing faulty magnets is reduced, hence reducing undesired disqualification of manufactured magnets for MRI use.

In U.S. Pat. No. 5,659,250 (Domigan et al.), titled FULL BRICK CONSTRUCTION OF MAGNET ASSEMBLY HAVING A CENTRAL BORE, filed in 1997, there was disclosed a permanent magnet assembly having a central eliptical bore, formed of a plurality of eliptically shaped sections. Each section is subdivided into a plurality of segments in which each segment is constructed of bricks of magnetic material. The bricks are arranged parallel to a common plane parallel to the bore axis and magnetized with magnetization vector oriented in a common direction perpendicular to the plane.

Note that the magnetization vectors described by Domigan are all parallel to the magnet annular plane, and it is therefore impossible to magnetize the entire magnet at once. Furthermore, as a consequence of the magnetization direction, the magnet segments do not experience repulsion forces as would magnet segments whose magnetization direction is perpendicular to the annular plane of the magnet experience in a similar arrangement. See also U.S. Pat. No. 5,148,138 (Miyata), titled CYLINDRICAL MAGNET APPARATUS SUITABLE FOR NMR IMAGING, which describes magnetic arrangement involving magnet segments whose magnetization vectors are parallel to the annular plane of the magnet.

It is clear that the problem of repulsion forces acting between magnet segments magnetized perpendicular to the annular plane of the magnet, as they are brought doser, is substantial and needs to be overcome, and the present invention discloses the ways of achieving this.

It is an object of the present invention to provide such a method and apparatus that would facilitate safe positioning of magnetized segments in a prearranged positions so as to form an annular magnet, and allow safe handling of the segments and binding them together to form the annular magnet.

BRIEF DESCRIPTION OF THE INVENTION

There is therefore thus provided, in accordance with a preferred embodiment of the present invention an apparatus for the construction of a segmented annular permanent magnet from a predetermined number of previously magnetized segments of predetermined shape and size, said apparatus comprising:

a rotatable carrousel comprising an upper platform and a lower platform, said platforms placed substantially parallel, adapted to receive between them, in an annular arrangement, said previously magnetized segments, at least two of a plurality of removable ferromagnetic segments adapted to be mounted and dismounted from said carrousel platforms, designated to shorten the magnetic flux of the previously magnetized segments when mounted on the carrousel;

an introducing means, adapted to introduce said previously magnetized segments onto said carrousel; and a removing means, adapted to facilitate the removal of said removable ferromagnetic segments from the carrousel.

Furthermore, in accordance with a preferred embodiment of the present invention, said platforms are detachable.

Furthermore, in accordance with a preferred embodiment of the present invention, said carrousel is further provided with fastening means for holding each of said previously magnetized segments in position once they are positioned.

Furthermore, in accordance with a preferred embodiment of the present invention, said apparatus further comprises a supporting body on which said rotatable carrousel, introducing means and removing means are mounted.

Furthermore, in accordance with a preferred embodiment of the present invention, said apparatus is designed to withstand a load of up to 600 kg.

Furthermore, in accordance with a preferred embodiment of the present invention, said apparatus, except said ferromagnetic segments, is made from diamagnetic material.

Furthermore, in accordance with a preferred embodiment of the present invention, said material is selected from annealed austonitic stainless steel, bronze, aluminum and glass-fiber.

Furthermore, in accordance with a preferred embodiment of the present invention, said supporting body is provided with a frame on its bottom, said frame provided with bores for bolts in order to secure the supporting body to a floor.

Furthermore, in accordance with a preferred embodiment of the present invention, said supporting body is provided with two lateral bores as to allow lifting and repositioning of said apparatus by means of inserting bars through said bores and lifting them.

Furthermore, in accordance with a preferred embodiment of the present invention, said supporting body is provided with vertical grooves, each on either side, so as to allow the installation of shielding to protect an operator of said apparatus from inadvertent jettisoning of magnetized segments.

Furthermore, in accordance with a preferred embodiment of the present invention, said apparatus is further provided with a drum adapted to be mounted on said carrousel and provide radial support to said previously magnetized segments.

Furthermore, in accordance with a preferred embodiment of the present invention, said drum comprises a plurality of segments, each defining a section of the drum, and coaxially mounted on said carrousel, between said platforms.

Furthermore, in accordance with a preferred embodiment of the present invention, said drum segments are spaced apart with gaps between them to allow convenient release of the drum segments thus facilitating convenient dismounting of said segmented annular permanent magnet after its construction is completed.

Furthermore, in accordance with a preferred embodiment of the present invention, said drum is provided with an upper annular recess and a lower annular recess so as to present shoulders for the accommodation of an internal rim of said parallel platforms.

Furthermore, in accordance with a preferred embodiment of the present invention, said drum is fastened to said parallel platforms by means of bolts.

Furthermore, in accordance with a preferred embodiment of the present invention, said at least two of a plurality of removable ferromagnetic segments comprise a plurality of annular segments.

Furthermore, in accordance with a preferred embodiment of the present invention, said at least two of a plurality of removable ferromagnetic segments are coupled to said parallel platforms by means of bolts.

Furthermore, in accordance with a preferred embodiment of the present invention, said carrousel is provided with locking means adapted to look said carrousel in position at a number of predetermined equiangular positions, said number equal to said number of previously magnetized segments.

Furthermore, in accordance with a preferred embodiment of the present invention, said locking means comprise a locking pin, adapted to be inserted into each of a number of matching bores provided on one of said platforms.

Furthermore, in accordance with a preferred embodiment of the present invention, said number of predetermined equiangular positions is in the range between 12 to 18.

Furthermore, in accordance with a preferred embodiment of the present invention, said number of predetermined equiangular positions is 16.

Furthermore, in accordance with a preferred embodiment of the present invention, said introducing means, removing means and carrousel are aligned along a substantially straight line.

Furthermore, in accordance with a preferred embodiment of the present invention, said introducing means comprises an arm coupled to a support block provided with clamping arms for holding one of said previously magnetized segments.

Furthermore, in accordance with a preferred embodiment of the present invention, said arm is a hydraulic arm.

Furthermore, in accordance with a preferred embodiment of the present invention, said clamping arms comprise two vertically oriented clamping arms.

Furthermore, in accordance with a preferred embodiment of the present invention, the apparatus further comprises an introduction chamber providing a predetermined pathway through which the magnetized segment is introduced to said carrousel.

Furthermore, in accordance with a preferred embodiment of the present invention, said introduction chamber is further provided with parallel grooves adapted to slidingly receive said clamping arms, and thus guiding said block along said predetermined pathway.

Furthermore, in accordance with a preferred embodiment of the present invention, said platforms are each provided with equiangular radial grooves, equal in number to said predetermined number of previously magnetized segments, and adapted to slidingly receive said clamping arms, thus guiding said segment to a predetermined position on said carrousel.

Furthermore, in accordance with a preferred embodiment of the present invention, there is provided, in accordance with a preferred embodiment of the present invention, a method for the construction of a segmented annular permanent magnet from a predetermined number of previously magnetized segments said method comprising:

a. selecting a predetermined number of previously magnetized annular segments;

b. arranging said previously magnetized annular segments in an annular arrangement;

c. coupling said previously magnetized annular segments together to form an annular permanent magnet.

Furthermore, in accordance with a preferred embodiment of the present invention, the step of selecting a predetermined number of previously magnetized annular segments further including matching said segments magnetic strength to ensure selection of segments of substantial magnetic strength homogeneity, having no or little variance in the magnetic field strength.

Furthermore, in accordance with a preferred embodiment of the present invention, the magnetized segments magnetic field strength variance is not greater than 50 ppm.

Furthermore, in accordance with a preferred embodiment of the present invention, said previously magnetized segments are introduced one at a time.

Furthermore, in accordance with a preferred embodiment of the present invention, said method further comprises a step of providing a carrousel onto which said previously magnetized segments are mounted and affixed in said annular arrangement Finally, in accordance with a preferred embodiment of the present invention, said previously magnetized segments are each affixed in position on said carrousel.

BRIEF DESCRIPTION OF THE FIGURES

The invention is described herein, by way of example only, with reference to the accompanying Figures, in which like components are designated by like reference numerals.

DETAILED DESCRIPTION OF THE INVENTION AND FIGURES

Figure 1:
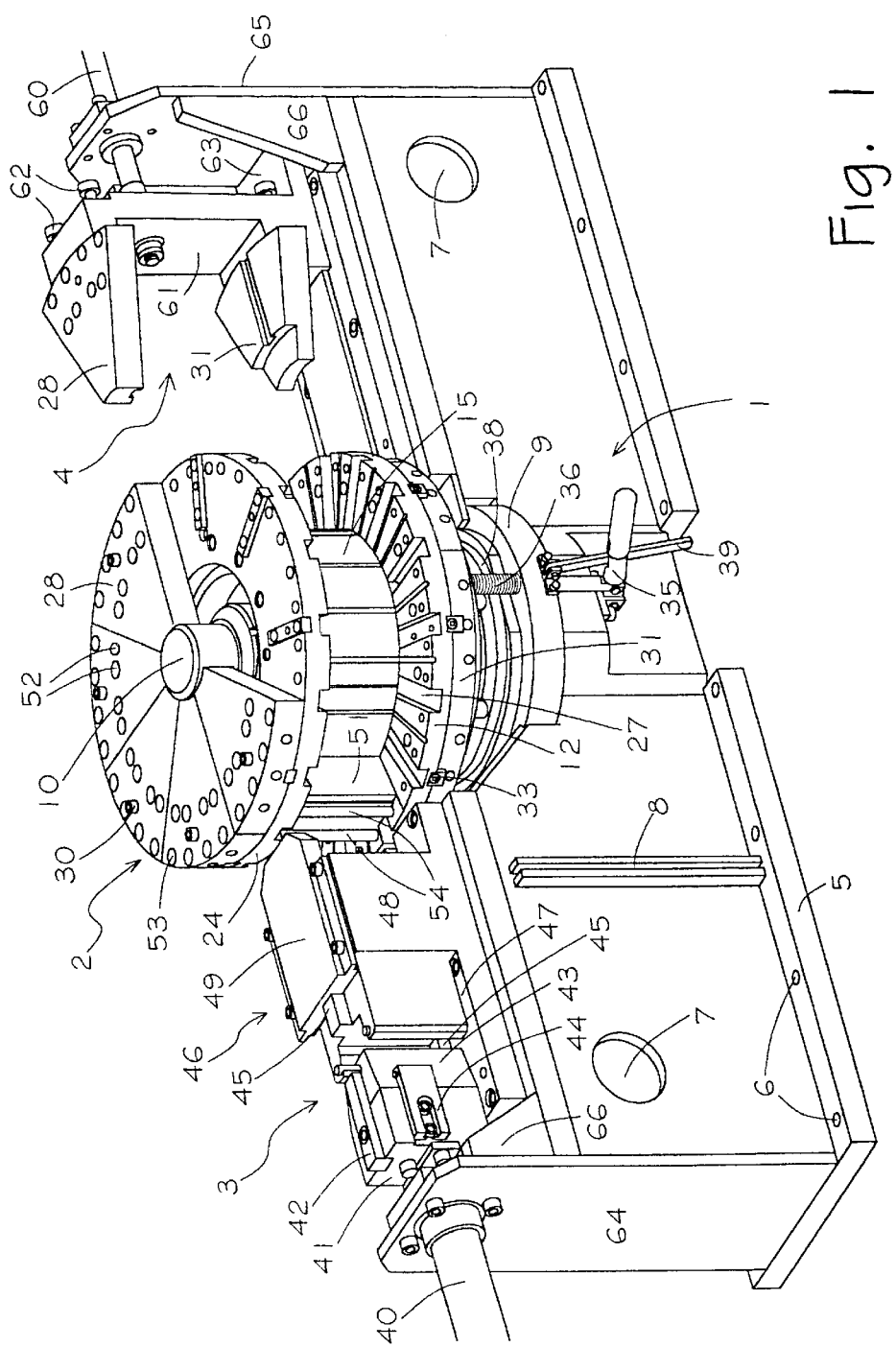
FIG. 1 illustrates a general view of an apparatus for assembling segmented annular permanent magnets having no ferromagnetic parts, in accordance with a preferred embodiment of the present invention.

A major aspect of the present invention is the construction of annular permanent magnet for MRI use from previously magnetized segments.

Another aspect of the present invention is the provision of a safe and convenient method of assembling the segments and forming the complete annular permanent magnet.

Yet another object of the present invention is to further provide a predetermined sequence for positioning of the segments that would further decrease the influence of the magnetic repulsion forces on the construction process, as would be explained hereafter.

Further object of the present invention is to provide an apparatus for assembling segmented annular permanent magnets, where the segments were magnetized prior to the assembling of the annular magnet As explained earlier, the method and apparatus disclosed in the present invention is aimed at constructing annular permanent magnets from previously magnetized segments.

It is therefore the first step in the method of the present invention, and a preliminary provision prior to the use of the apparatus of the present invention, to select a predetermined number of previously magnetized segments designated to make up the complete annular magnet. The process of producing magnetized segments is a cumbersome process involving, first, the compression of the magnet material and shaping of the segment to a predetermined shape, and then magnetization of the segment in the manner described above. Using the available technology to date it is yet fairly impractical to expect that each segment manufactured possessed the same magnetic strength. Due to unavoidable manufacturing defects, such as voids within the compressed material, unbalanced pressure applied during the compression of the material, flaws in the magnetization procedure, and more, it is usually required to manufacture more magnetized segments than actually needed, and then select magnetized segments whose magnetic field strength is substantially the same. Practically it is possible to match segments possessing substantially equal magnetic strength with variance of about not more than 50 ppm. This number is not a limitation on the scope of the present invention, as segments with magnetic field strength variance of not more than 50 ppm may also be considered with respect to the method and apparatus disclosed in the present invention, but for the purpose of manufacturing segmented annular permanent magnets to be used in MRI systems it is recommended that the variance be not more that 50 ppm, as the efficiency of the MRI system relies on the homogeneity of the magnetic field in the filed of view.

It is therefore imperative that the magnetic field strength and direction of the selected segments be tested and measured (this can be done using a gauss-meter or a tesla-meter), and only segments having substantially equal magnetic field strength be qualified for use.

Once the predetermined number of magnetized segments were selected the next step follows.

The remaining steps of method and the apparatus of the present invention are hereafter explained with reference to the accompanying Figures.

Reference is now made to FIG. 1, illustrating a general isometric view of an apparatus for the assembling of segmented annular permanent magnets, in accordance with a preferred embodiment of the present invention.

Primarily the apparatus comprises a supporting body 1, a carrousel 2, an introducing means 3 for the introduction of the previously magnetized segments onto the carrousel 2, in a manner described herein, and removing means 4, for the removal of ferromagnetic plates employed to create return paths of the magnetic flux, and thus reducing its influence in the immediate surroundings, once the annular magnet is assembled and the binding of the segments accomplished.

Supporting body 1 and, in particular, carrousel 2 are preferably constructed from suitable materials that may withstand high loads (typical loads for an apparatus designated for the assembly of a 20 cm-radius magnet, with additional accessories, as later described, may be as high as 600 kgs. For magnets of greater radii the anticipated loads are much greater. However these materials cannot be ferromagnetic, as that would render the apparatus inapt for its intended use. Examples of suitable materials for the construction of the supporting body and the carrousel, which are diamagnetic, include annealed austonitic stainless steel, bronze, aluminum, and glass-fiber.

Supporting body 1 is provided with frame 5 at its bottom to allow greater stability, the frame further provided with bores 6 through which bolts may be screwed and secure the body in position, either on the floor or on another surface (such as a table). It has two perpendicular plates, 64 and 65, each protruding vertically over a far end of the body, and provided with reinforcement plates 66 to secure the perpendicular plates in position, preventing possible break as a result of the load put on it.

Supporting body 1 is also provided with two bores 7, extending laterally through the body. The bores are provided so as to allow lifting of the whole apparatus and repositioning it, by threading bars through the bores and, while balancing the whole construction, lifting the bars using lifting means (such as a jack or other lifter). Additionally, supporting body 1 is provided with two vertical grooves 8, each one on an opposite side of the body. This is to allow the insertion of an edge of a shielding plate (not shown in the Figures) through each of these grooves, and provide protection to the operator of the apparatus from inadvertent release, and subsequent jettisoning of a loose segment away from the carrousel. It should be noted that substantial repulsion forces are present between the magnetized segments.

Figure 2:
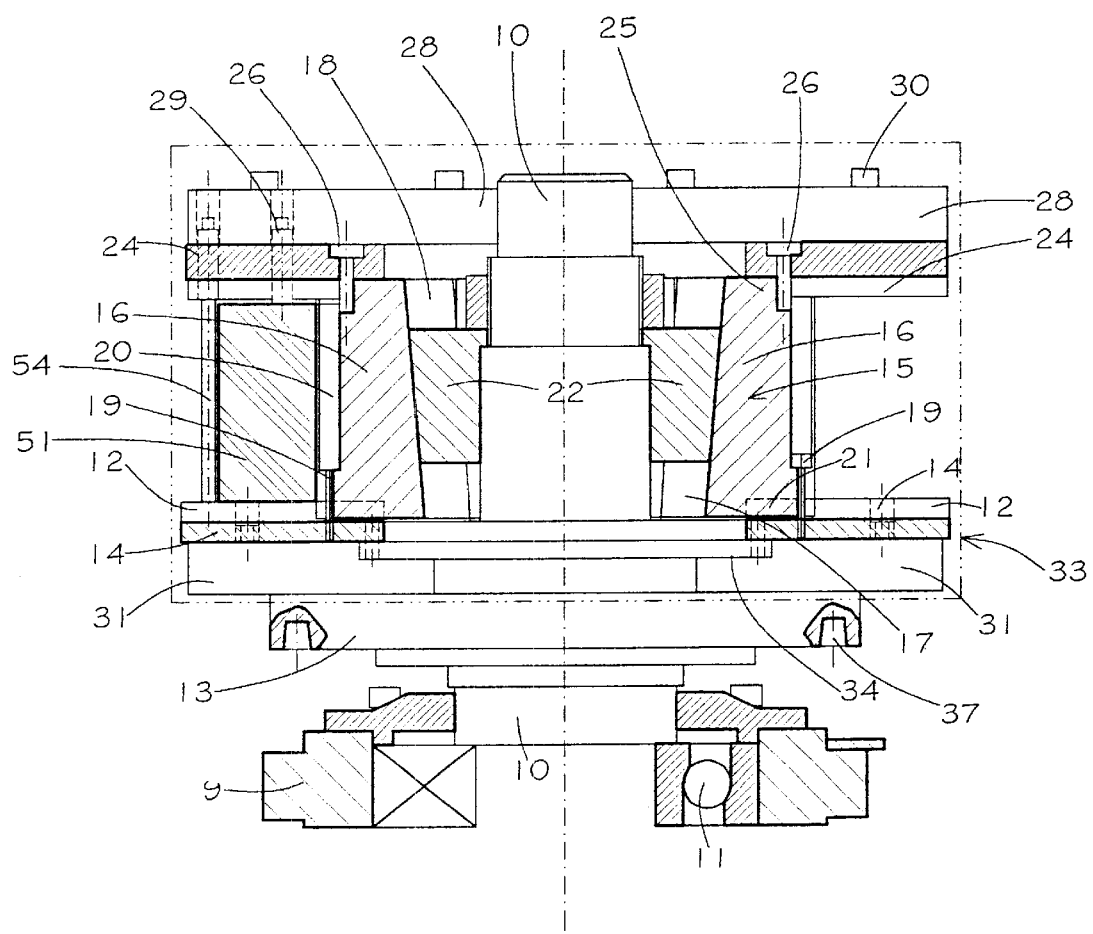
FIG. 2 provides a sectional view of the carousel and its supporting column, of an apparatus for assembling segmented annular permanent magnets, in accordance with a preferred embodiment of the present invention, same as shown in FIG. 1.

Over the supporting body 1, at about its center, a carrousel 2 is mounted. Reference is now made to FIG. 2, which depicts a vertical cross-section view of the carrousel. The carrousel comprises an annular platform 12 having a central bore 17, mounted over a circular plate 13, and fastened to it by bolts 14. The circular plate is coupled to an axle 10, which is inserted into a vertical bore inside the supporting body of the apparatus of the present invention (not shown in FIG. 2). The bore, whose upper opening is located on a base support 9, which is integrally formed with supporting body 1, is designed to accommodate axle 10, and allows it to rotate about the axle's longitudinal axis. Axle 10 is supported by ball bearings 11, to provide substantially friction-free rotation of the axle.

A drum 15, made of a number of segments (four segments in the apparatus shown in FIG. 2), each defining a longitudinal section of the drum (with respect to is axial orientation), is coaxially mounted over axle 10. The drum is provided with an annular recess 21 at its bottom, so that the bottom of drum 15 is inserted inside central bore 17 and supported by annular platform 12. The drum segments 16 are each fastened at the bottom to annular platform 12 by bolts 19, which are inserted in bores 20 provided in each of the segments 16. The drum is designed to support the second annular platform (as explained hereafter), and also provide brace for the magnet segments when they are mounted on the carrousel.

The four segments 16, defining drum 15, are spaced apart with gaps 18 between them, so as to allow a convenient release of the drum segments, as is later explained. In order to hold drum segments 16 defining the drum 15 in their relative position, maintaining the gaps between them, an annular fixator 22 is used, pressing against drum segments 16, holding them in place (it may optionally be bolted to the drum segments 16.

Drum 15 is further provided with an annular recess 25 at its top so as to present a shoulder onto which a second annular platform 24 is mounted, substantially perpendicular to the first annular platform. The second annular platform is also provided with a central bore through which the tapered portion of drum 15, defined by the annular recess 25, is inserted. Second annular platform 24 is fastened to drum 15 by bolts 26, threaded through bores provided in second annular platform 24.

In order to shortcut magnetic flux (of the magnet which is to be constructed on the apparatus) two segmented ferromagnetic structures are provided—one mounted over the second annular platform 24 and the other attached beneath first annular platform 12. The magnetic structures are preferably segmented annular rings, or sections. The segments 28 of the upper ferromagnetic structure are each fastened to the second annular platform by bolts 29 (only one is shown for the sake of brevity) threaded through bores provided in the segments. The segments 31 of the lower ferromagnetic structure are attached to the first annular platform by bolts 33, inserted sideways through a nm 32 provided to the segment 31, in order to facilitate convenient screwing and unscrewing of the bolts 33. Segments 31 are provided with an annular recess 34 adapted to accommodate the rim of circular plate 13.

Note that annular platforms 12 and 24 are preferably detachable so as to aid in the dismounting of the constructed magnet when ready.

Reference is now made back to FIG. 1. Carrousel 2 is rotatable about its vertical axis, but it is desirable to fix the carrousel in a predetermined position when mounting the magnetized segments onto it. Therefore a locking pin 38 is provided on the base support 9, which can be inserted in matching bores (37 in FIG. 2) provided on the undercarriage of the carrousel (i.e. on the bottom of circular plate 13 or, optionally, ferromagnetic segment 31). The bores are circularly aligned, in equiangular positions, equidistant from each other and the number of the bores is equal to the number of segments to comprise the annular magnet to be constructed. The embodiment shown in FIG. 1 is designed to construct a 16-segment permanent magnet, and therefore the undercarriage of the carrousel is provided with 16 circularly aligned and evenly spaced bores. For practical construction reasons, stemming from physical and construction constraints, it is recommended to set the predetermined number of segments to make up the constructed magnet in the range of 12 to 18 segments.

The locking pin 36 is held in position inside the bore by a spring 38 and may be withdrawn from the bore by lever 35, which is pivotally connected to supporting body 1 underneath locking pin 36. In order to avoid twisting of the locking pin when lever 35 is actuated a stabilizing bar 39 is provided, inserted through a slit inside lever 35. By pulling lever 35 upwards locking pin 36 is retracted from the bore, allowing carrousel 2 to be rotated in a predetermined angle of rotation and when lever 35 is released, spring 38 fores pin 36 upwards into the next bore, which was previously positioned over the pin.

The carousel 2 is positioned between introducing means 3 and removing means 4. This alignment is not critical, and the introducing means 3 and removing means 4 may be positioned in any other alignment as long as each is provided with a direct access to carrousel 2. However, it is preferable to align the carrousel, the introducing means and the removing means along a substantially straight line, as shown in FIG. 1, as it facilitate convenient approach and space around the carrousel.

Introducing means 3 is designed to introduce a magnetized segment onto carrousel 2, in between the first and second annular platforms at a predetermined position. The introducing means comprises an arm 40 (preferably a hydraulic arm) coupled to a support block 41 provided with two vertically oriented clamping arms 42 (the second arm underneath block 41 not shown in FIG. 1) for holding the magnetized segment 43. An additional horizontally oriented clamp 44 is provided for fine adjustment of the position of the magnetized segment so as to ensure that it is properly aligned. An introduction chamber 46, comprising floor 47, two parallel walls 48 and lid 49 provides a predetermined pathway through which the magnetized segment is introduced to carrousel 2. The introduction chamber is designed to limit the access to the carrousel to a specified path and also prevent inadvertent jettisoning of the magnetized segment due to repulsion forces exerted by magnetized segments already on the carrousel. It is recommended that the lateral dimension of support block 41 not be greater than, preferably even equal to, the lateral dimension of the magnetized segments. so that it provides an effective support to the magnetized segment and manages to pass through introduction chamber 46.

Two parallel grooves 45 on floor 47 and lid 49 adapted to slidingly receive damp arms 42 make sure the magnetized segment is brought precisely to its target location on the carrousel. First annular platform 12 and second annular platform 24 are each provided with radial grooves 27 adapted to receive damp arms 42, so as to guide the magnetized segment directly to a predetermined position on the carrousel. Each platform has a predetermined number of equiangular radial grooves 27, evenly spaced apart, and equal to the number of segments to be assembled on the carrousel.

The construction method of an annular permanent magnet in accordance with a preferred embodiment of the present invention is explained herein, with reference to the Figures.

First, a plurality of magnet segments of predetermined size and shape is produced in a known manner. The segments are shaped to present a predetermined number of sectors of an annular structure (a ring or a disc). For practical reasons, mainly due to manufacture constraints governing the maximum size of magnetized segments, an annular magnet with about 20 cm radius is preferably divided into some 12–20 segments. The apparatus shown in FIG. 1 has a carrousel suitable for a 16-segments annular magnet.

The annular permanent magnet manufactured in the method of the present invention is primarily designed to be used in an MRI system (even if not solely for that purpose). In order for a magnet to be suitable for use in MRI systems it is important that the magnetic field be homogeneous over a substantial volume so that good images are obtained. Non-homogeneity in the magnetic field may result in distortions of the image and appearance of artifacts.

It is therefore why the selection of the magnetized segments involves testing the prefabricated magnetized segments and measuring their magnetic field strength, and choosing only segments with substantially same magnetic field strengths. It is recommended that the variance in magnetic field strength of the selected magnetized segments be not more than 100 ppm, and preferably not more than 50 ppm.

Obviously the selected magnetized segments ought to be kept separately or at least at a safe distance from each other or else they would be attracted and coupled to each other. Very strong forces are required to pull apart two coupled segments, and while attempting to separate them they may be deformed or cracked.

Then, the first magnetized segment is placed and fastened to support block 41, clamp arms 42 holding it in place. Clamp arms 44 are used to align the segment and then they are removed. In their final position, the magnetized segments are to be positioned juxtaposed to each other on the carrousel, and therefore there is no room for arms 44 on the carrousel. Hydraulic arm 40 is actuated to advance the magnetized segment and guide it to a predetermined position on carrousel 2, which is turned to present that predetermined position to the introducing means The. carrousel is locked in position by the locking pin 36, to prevent unintentional rotation.

When the first segment 51 is positioned on the carrousel, it is held in position by bolts screwed into bores 52 provided in the upper ferromagnetic structure segments 28, and also by restraining pins 54, inserted through bores 53 also provided in the upper ferromagnetic structure segments 28. These restraining means play an important role since the segments are not glued to the carrousel but to each other.

The clamp arms 42 are then released, and the segment released from the introducing means, and left positioned in place on the carrousel. Then locking pin 36 is retracted, and the carrousel is rotated in a predetermined angle to present the next predetermined free position on the carrousel to the introducing means.

According to a preferred method of construction disclosed in the present invention, the next segments are mounted on the carrousel in the manner described herein.

First, the segments are positioned on the carrousel at every other position (skipping one position at a time—hereafter referred to as the "odd positions"). As the magnetic field strength is inversely proportional to the distance from the magnet, this method of positioning is aimed at preventing as much as possible the development of substantially strong repelling forces between the. segments that would prevent proper positioning of the segments on the carrousel.

Once the odd positions on the carrousel are occupied, the rest of the segments are then each positioned in one of the remaining positions, between the odd positions (hereafter referred to as the "even positions"), now filled by an already positioned segment.

The positioning of the segments in the "even positions" is subjected to stronger repelling forces acting between the introduced segment and the already positioned adjacent segments. As the introduced segment nears the already-positioned segments, the co-aligned magnetic polarization yields forces attempting to flip the introduced segment over, turning its polarity and presenting the already-positioned segments a segment with opposite polarities.

In order to overcome these forces the introducing means needs to counteract the repelling forces. This is where the introduction chamber 46, the clamp arms 42 and clamp arms 41 play a major role, holding firmly the introduced segment as it is advanced towards its predetermined position on the carrousel, and guiding it directly to the target location.

An adhesive coating film is applied onto the side of the segments, which are to be coupled to the adjacent segments. The adhesive coating has to be made of an insulating material, such as epoxy glue, in order to prevent eddy currents from developing over the entire constructed magnet, or even over several segments, during its operation. A recommended adhesive is construction epoxy known as E32, available by Permabond Inc.

After the last magnetized segment has been positioned in its predetermined position on the carrousel, the constructed magnet is left fastened to the carrousel for the time needed for the adhesive to dry up and firmly bond the segments together. A typical drying time for E32 epoxy would be about 11 hours (as recommended by the manufacturer).

Removing means 4 is brought to action once the adhesive has dried up, and it is safe to remove the constructed magnet from the carrousel. It comprises an arm 60, optionally a hydraulic arm, capable of being moved to and fro along a radial direction of carrousel 2. At the proximal end of the arm, which is closer to the carrousel than the distal end of the arm, a block 61 is coupled. Block 61 is provided with two pairs of bolts, 62 and 63, treaded through said block, one pair of bolts located at the top of the block and the other pair provided on its bottom. Each pair of bolts is designed to be screwed and be attached to ferromagnetic segment. The top pair of bolts 62 is fastened to a ferromagnetic segment 28 located on the top of the second annular platform 24, and the bottom pair of bolts 63 to a ferromagnetic segment 31 located underneath the first annular platform 12. Since the ferromagnetic segments are previously fastened to their adjacent annular platform, the fastening bolts need to be unscrewed and removed to allow the removal of the ferromagnetic segments from the carrousel. Once the fastening bolts are removed arm 60, carrying block 61, may be retracted, removing as it moves the ferromagnetic segments attached to the block. This is repeated until all ferromagnetic segments are removed from the carrousel.

Finally, the upper (second) annular platform and drum 15 are removed, and the constructed annular magnet is dismounted from the carrousel. When the carrousel houses a fully. constructed annular magnet, there is a considerable force exerted on the drum 15 by the magnet segments. As mentioned earlier, the drum segments are spaced apart, and when the annular fixator 22 is removed the segments can simply collapse inwardly, and may be easily removed.

In case of troubles in the dismounting of the magnet from the carrousel, caused by the adhesive spilling over the first annular platform, and gluing the magnet to it, releasing bolts 67 are provided on the first annular platform, which upon screwing them in detach the magnet from the annular platform.

It is noted that the introduction of the method and apparatus of the present invention bring about remarkable advantages, some of which are summed up here:

The use of previously magnetized segments in the construction of annular permanent magnets, as opposed to the magnetization of the complete annular body of the magnet after its formation, allows precise selection of magnetized segments with the same magnetic field strength. In fact, owing to the precision of magnetic strength measurement tools, the selection of segments with same magnetic strength can be very accurate (in the limit of as much as 50 ppm).

The magnetization device used to magnetize the segments prior to the formation of the annular magnet may be much smaller, and hence considerably cheaper to build and maintain, than the magnetization device needed to magnetize an already assembled annular construction.

During the process of magnetization cracks and deformations may occur. Disqualifying one or a few segments is much preferable instead of disqualifying the whole annular magnet, and the cost implications are significant.

Even the mechanical processing of each of the segments is relatively simpler and easier, as the processing equipment needed is smaller and therefore less costly.

It should be clear that the description of the embodiments and attached Figures set forth in this specification serves only for a better understanding of the invention, without limiting its scope as covered by the following Claims.

It should also be clear that a person in the art, after reading the present specification could make adjustments or amendments to the attached Figures and above described embodiments that would still be covered by the following Claims.

What is claimed is:

1. An apparatus for constructing a segmented annular permanent magnet from a predetermined number of previously magnetized segments of predetermined shape and size, said apparatus comprising:

a rotatable carrousel comprising an upper platform and a lower platform, said platforms being placed substantially parallel to one another and adapted to receive between themselves, in an annular arrangement, said previously magnetized segments, at least two of a plurality of removable ferromagnetic segments designated to shorten a magnetic flux of the previously magnetized segments when mounted on the carrousel;

an introducing means for introducing said previously magnetized segments onto said carrousel, between the first and second platforms; and a removing means to facilitate removal of said removable ferromagnetic segments.

2. The apparatus as claimed in claim 1, wherein said platforms are detachable.

3. The apparatus as claimed in claim 1, wherein said carrousel is further provided with fastening means for holding each of said previously magnetized segments in position once they are positioned.

4. The apparatus according to claim 1, further comprising a supporting body on which said rotatable carrousel, introducing means and removing means are mounted.

5. The apparatus as claimed in claim 4, wherein said supporting body is provided with a frame on its bottom, said frame provided with bores for bolts in order to secure the supporting body to a floor.

6. The apparatus as claimed in claim 4, wherein said supporting body is provided with two lateral bores as to allow lifting and repositioning of said apparatus by means of inserting bars through said bores and lifting them.

7. The apparatus as claimed in claim 4, wherein said supporting body is provided with two vertical grooves, each on either side, so as to allow installation of shielding to protect an operator of said apparatus from inadvertent jettisoning of magnetized segments.

8. The apparatus as claimed in claim 1, wherein said apparatus is designed to withstand a load of up to 600 kg.

9. The apparatus as claimed in claim 1, wherein said apparatus, except said ferromagnetic segments, is made from diamagnetic material.

10. The apparatus as claimed in claim 9, wherein said material is selected from the group consisting of annealed austonitic stainless steel, bronze, aluminum and glass-fiber.

11. The apparatus as claimed in claim 1, further provided with a drum adapted to be mounted on said carrousel and provide radial support to said previously magnetized segments.

12. The apparatus as claimed in claim 11, wherein said drum comprises a plurality of segments, each defining a section of the drum, and coaxially mounted on said carrousel, between said platforms.

13. Apparatus according to claim 12, wherein said drum segments are spaced apart with gaps between them to allow convenient release of the drum segments thus facilitating convenient dismounting of said segmented annular permanent magnet after its construction is completed.

14. The apparatus as claimed in claim 12, wherein said drum is provided with an upper annular recess and a lower annular recess so as to present shoulders to accommodate an internal rim of said parallel platforms.

15. The apparatus as claimed in claim 14, wherein said drum is fastened to said parallel platforms by means of bolts.

16. The apparatus as claimed in claim 1, wherein said at least two of a plurality of removable ferromagnetic segments comprise a plurality of annular segments.

17. The apparatus as claimed in claim 16, wherein said at least two of a plurality of removable ferromagnetic segments are coupled to said parallel platforms by means of bolts.

18. Apparatus according to claim 1 wherein said carrousel is provided with locking means adapted to lock said carrousel in position at a number of predetermined equiangular positions, said number equal to said number of previously magnetized segments.

19. Apparatus according to claim 18, wherein said locking means comprise a locking pin, adapted to be inserted into each of a number of matching bores provided on one of said platforms.

20. Apparatus according to claim 18, wherein said number of predetermined equiangular positions is in the range between 12 to 18.

21. Apparatus according to claim 20, wherein said number of predetermined equiangular positions is 16.

22. Apparatus according to claim 1, wherein said introducing means, removing means and carousel are aligned along a substantially straight line.

23. Apparatus according to claim 1, wherein said introducing means comprises an arm coupled to a support block provided with clamping arms for holding one of said previously magnetized segments.

24. Apparatus according to claim 23, wherein said arm is a hydraulic arm.

25. Apparatus according to claim 23, wherein said clamping arms comprise two vertically oriented clamping arms.

26. Apparatus according to claim 23, further comprising an introduction chamber providing a predetermined pathway through which the magnetized segment is introduced to said carrousel.

27. Apparatus according to claim 26, wherein said introduction chamber is further provided with parallel grooves adapted to slidingly receive said clamping arms, and thus guiding said block along said predetermined pathway.

28. Apparatus according to claim 27, wherein said platforms are each provided with equiangular radial grooves, equal in number to said predetermined number of previously magnetized segments, and adapted to slidingly receive said clamping arms, thus guiding said segment to a predetermined position on said carousel.

29. An apparatus for constructing a segmented annular permanent magnet comprising a plurality of previously magnetized segments, the apparatus comprising:

a rotatable carrousel comprising spaced apart first and second platforms that are parallel to one another and define an annular space therebetween, the annular space being of sufficient size to accommodate said plurality of previously magnetized segments;

a first plurality of removable ferromagnetic segments connected to the first platform and a second plurality of removable ferromagnetic segments connected to the second platform, said first and second pluralities of removable ferromagnetic segments shortening a magnetic flux of at least one of said plurality of previously magnetized segments, when said at least one of said plurality of previously magnetized segments is positioned between the first and second carrousels;

an introduction device configured to insert a previously magnetized segment into said annular space, said introduction device comprising a clamp and a first movable arm operatively connected to the clamp, the first movable arm configured to urge a previously magnetized segment retained in the clamp, in a direction towards said annular space; and a removal device configured to retain and remove at least one of said first and second pluralities of previously magnetized segments from a corresponding platform, the removal device comprising a second movable arm configured to withdraw said at least one of said first and second pluralities of previously magnetized segments, in a direction away from said carrousel.

* * * * *